Figure 1:
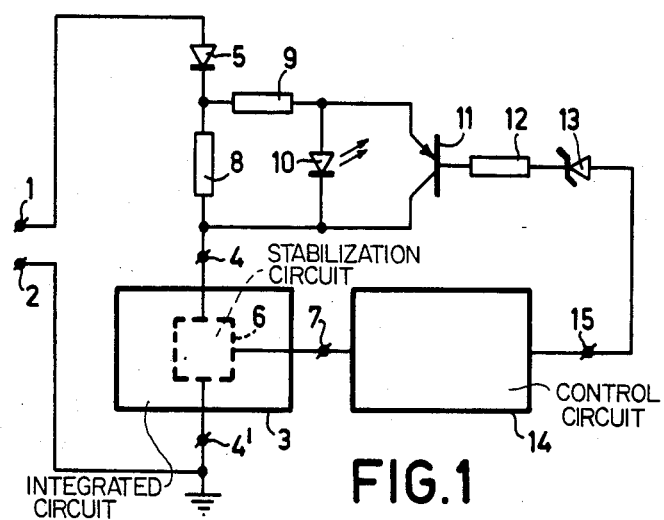

United States Patent [19]

Damstra

[11] Patent Number: 4,672,367
[45] Date of Patent: Jun. 9, 1987

[54] OPTICAL INDICATOR DEVICE

[75] Inventor: Ate K. Damstra, Drachten, Netherlands

[73] Assignee: U.S. Philips Corporation, New York, N.Y.

[21] Appl. No.: 574,772

[22] Filed: Jan. 27, 1984

[30] Foreign Application Priority Data

Feb. 7, 1983 [NL] Netherlands ................. 8300449

[51] Int. Cl.⁴ ............................................. G08B 21/00
[52] U.S. Cl. .................................... 340/657; 340/648; 340/635; 315/136
[58] Field of Search ............... 340/644, 691, 762, 651, 340/648, 653, 654, 657, 658, 660, 664, 523, 645, 635; 315/135, 136; 318/490

[56] References Cited

U.S. PATENT DOCUMENTS

| 3,636,541 | 1/1972 | Genuit et al. | 340/658 |
| 3,838,294 | 9/1974 | Leete | 340/658 |
| 3,969,672 | 7/1976 | Wallander et al. | 340/762 |
| 4,017,847 | 4/1977 | Burford et al. | 340/762 |
| 4,034,369 | 7/1977 | Tanigawa et al. | 340/691 X |
| 4,389,124 | 6/1983 | Longnecker | 340/762 |

FOREIGN PATENT DOCUMENTS

| 0048655 | 3/1982 | European Pat. Off. | |
| 212850 | 8/1984 | Fed. Rep. of Germany | 340/658 |

*Primary Examiner*—James L. Rowland
*Assistant Examiner*—Jeffery A. Hofsass
*Attorney, Agent, or Firm*—Robert T. Mayer; Bernard Franzblau

[57] ABSTRACT

An optical indication circuit in which a light-emitting diode is included in the feed current path of an IC which is energized via a dissipation resistor and a rectifier diode directly from the alternating voltage supply.

11 Claims, 2 Drawing Figures

OPTICAL INDICATOR DEVICE

The invention relates to an optical indicator device comprising at least one parallel-combination of a light-emitting element and a switch for switching this element on and off, which parallel-combination is arranged in a current path for feeding said element in the switched-on condition. Such an optical indicator device can be used inter alia in domestic apparatus having an electronic speed control effected by means, for example, of phase control, such as vacuum-cleaners, kitchen machines and drilling-machines.

An optical indicator device of the kind specified in the opening paragraph is known, for example, from German Patent Application No. 22,40.105 laid open for public inspection, in which a current is supplied to the said current path by means of a current source fed from a direct voltage source.

In the said application, an electronic circuit of the simplest possible construction is desired. A direct voltage supply source coupled via a transformer to the alternating voltage supply is therefore often undesirable. When, for example, C-MOS integrated circuits are used, that kind of supply can often be avoided by providing the ICs, which require only a small current, with an internal voltage stabilizer and connecting the latter via a rectifying diode and a dissipation resistor directly to the alternating voltage supply. Since the internal voltage stabilizer of such an IC is not capable of supplying the feed current for the light-emitting elements, for example light-emitting diodes, a separate direct voltage source would in such a case have to be present for feeding these elements, which is too expensive. An alternative would be to also feed these elements from the alternating voltage supply, but this entails additional dissipation as well as additional components.

The invention has for an object to provide an optical indicator device of the kind specified in the opening paragraph having a low additional dissipation and requiring a small number of additional components. For this purpose, the invention is characterized in that the current path forms part of a current feed circuit for an integrated circuit and is connected in series with a dissipation resistor, a rectifying element and this integrated circuit between terminals for connection to an alternating voltage supply.

The invention is baased on the recognition of the fact that this solution, apart from the light-emitting element itself and the switch, does not require additional components and that this solution does not entail additional dissipation because the power dissipated by the dissipation resistor would have to be dissipated anyway to provide the reduction required for the IC supply. An optical indicator device according to the invention may further be characterized in that the series-combination of the light-emitting element and the dissipation resistor has connected in parallel with it a further dissipation resistor for reducing the current flowing through the said current path with respect to the feed current for said integrated circuit.

A still further feature of an optical indicator device according to the invention may be that a control input of the switch is coupled via a voltage level displacement circuit to a control circuit and also that the integrated circuit is provided with a voltage stabilizer which supplies the feed voltage for the control circuit.

Figure 2:
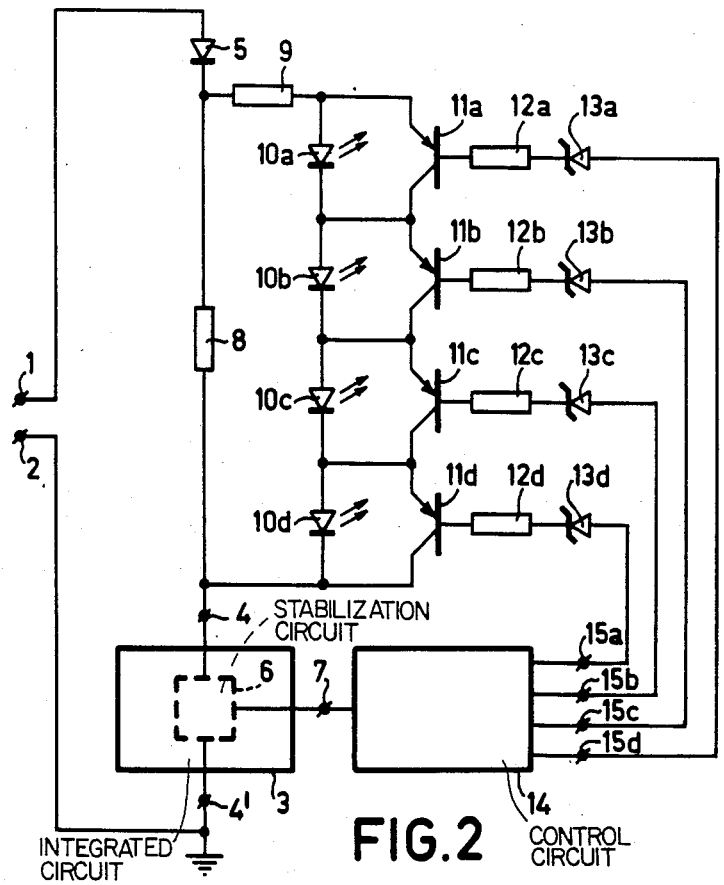

The invention will be described more fully with reference to the drawing, in which:

FIG. 1 shows an embodiment of the invention comprising one light-emitting diode, and FIG. 2 shows a similar embodiment comprising several light-emitting diodes.

FIG. 1 shows an optical indicator device according to the invention. It comprises an integrated circuit 3, for example, a C-MOS IC for phase control which is fed between terminals 4 and 4' with a current subjected to half-wave rectification. In this embodiment the terminal 4' is connected not only to the ground connection of the device but also to a terminal 2 for connection to a 220 V alternating voltage supply. The terminal 4 is connected via a dissipation resistor 8 and a diode 5 to a terminal 1 for connection to the alternating voltage supply. For the IC 3, there is produced by means of a voltage stabilization circuit 6 a direct voltage, which in this embodiment is applied to a terminal 7. If the IC3 is used to control the speed of a vacuum cleaner motor by phase control, the IC may comprise the integrated circuit ETL9313 XMR sold by Thomson-CSF. This IC includes an internal voltage stabilization circuit. A light-emitting diode 10 in series with a resistor 9 is connected in parallel with the resistor 8. The light-emitting diode has connected in parallel with it a pnp switching transistor 11 which is connected via a base resistor 12 and a Zener diode 13 to the output 15 of a control circuit 14, which is fed by the voltage at the terminal 7. The feed current for the IC 3 is rectified by the diode 5 and is passed at least in part through the resistor 9 and the parallel-combination of the light-emitting diode 10 and the transistor 11. As a result, the feed current for the IC 3 is utilized at least in part also as the feed current for the light-emitting diode 10. If, for example, the alternating voltage is 220 V and if the IC requires a current having a peak value of 45 mA and a maximum voltage at the terminal 4 of the IC of 13.5 V, it can be calculated that a power of 6.7 W has to be dissipated. This is effected in the resistors 8 and 9. If the light-emitting diode 10 requires a current having a peak value of 15 mA, i.e. $\frac{1}{3}$ of the current required by the IC, the resistors 8 and 9 must have values with a ratio of 1:2. Taking into account the power to be dissipated, approximately the values of 10 kΩ and 20 kΩ are then found for the resistors 8 and 9, respectively.

In order to switch off the light-emitting diode, the latter can be shortcircuited by means of the transistor 11, which substantially does not influence the current flowing through the pin 4. Since the emitter of the transistor 11 is at a higher voltage level than the output 15 of the control circuit 14—which in fact produces a voltage lower than the peak value of the voltage at the terminal 4—a voltage level displacement between the base of the transistor 11 and this output is required. This displacement is obtained by a base resistor 12 and a Zener diode 13. If the current required by the IC 3 has such a value that the light-emitting diode 10 can operate at that current value, the dissipation resistor 8 is superfluous.

FIG. 2 shows an optical indicator device according to the invention comprising four light-emitting diodes. The circuit corresponds to that of FIG. 1 with the exception that the light-emitting diode 10 is replaced by the series-combination of four light-emitting diodes 10a, 10b, 10c and 10d which are each connected in parallel with a switching transistor, 11a, 11b, 11c and 11d respectively. The bases of these switching transistors are connected via base resistors 12a, 12b, 12c and 12d, respectively, and Zener diodes 13a, 13b, 13c and 13d, respectively, to outputs 15a, 15b, 15c and 15d, respectively, of the control circuit 14.

By means of the control circuit 14, one of the diodes can be switched on by shortcircuiting the remaining three diodes. The circuit then behaves like that shown in FIG. 1. For example, the control circuit may consist of four parallel switches which are activated, i.e. switched from a normally on state to a cut-off state, in sequence, as the voltage at the control input 7 increases in value. It is also possible to switch on several diodes without noticeably influencing the operation of the supply of the IC 3 because the operating voltage (1.5 V) of these light-emitting diodes is considerably lower than the supply voltage.

The invention is not limited to the embodiments shown. For example, full-wave rectification may be used, the control circuit 14 may be integrated together with the circuit 3, the circuit 14 may be fed in a similar manner as in the circuit 3 by the rectified current via the terminal 4, and an exxternal stabilizer, for example, a smoothing capacitor, may be provided at the terminal 4 instead of the internal stabilizer 6. Further, the switch (11, 12, 13) may be constructed differently.

What is claimed is:

1. An optical indicator device comprising at least one parallel-combination of a light-emitting element and a switch for switching said element on and off, the parallel-combination being included in a current path for feeding said element in the switched-on condition, a control input of the switch being coupled via a voltage level displacement circuit to a control circuit, and a current feed circuit for an integrated circuit comprising means connecting the current path in series with a dissipation resistor, a rectifying element and the integrated circuit between terminals for connection to an alternating voltage supply so that the current path forms a part of the current feed circuit for the integrated circuit.

2. An optical indicator device as claimed in claim 1, characterized in that the integrated circuit includes a voltage stabilizer which supplies a feed voltage for the control circuit.

3. An optical indicator device comprising: a pair of terminals for connection to a source of AC supply voltage, a current rectifying element, a resistor, a light-emitting diode and a controlled transistor switch connected together in a parallel-combination, an integrated circuit, means serially connecting the rectifying element, the resistor, the parallel-combination and the integrated circuit between said pair of terminals to provide a current feed circuit for the integrated circuit and for the light-emitting diode, and a control circuit having an input coupled to the integated circuit and an output coupled to a control electrode of the semiconductor switch so as to trigger the semiconductor switch on and off as a function of a control voltage supplied by the integrated circuit to the input of the control circuit, said semiconductor switch in the on state short circuiting the light-emitting diode in a manner such that the feed current to the integrated circuit is substantially the same in either state of the semiconductor switch.

4. An optical indicator device as claimed in claim 3 wherein the output of the control circuit is coupled to the transistor switch control electrode via a voltage level displacement circuit.

5. An optical indicator device as claimed in claim 4 wherein the voltage level displacement circuit includes a zener diode.

6. An optical indicator device comprising: a pair of terminals for connection to a source of AC supply voltage, a current rectifying element, a resistor, a light-emitting element and a controlled semiconductor switch connected together in a parallel-combination, an integrated circuit, means serially connecting the rectifying element, the resistor, the parallel-combination and the integrated circuit between said pair of terminals to provide a current feed circuit for the integrated circuit and for the light-emitting element, a second parallel-combination of a second light-emitting element and a second controlled semiconductor switch with said second parallel-combination also serially connected with the first parallel-combination and the integrated circuit, and a control circuit having an input coupled to the integrated circuit and output means coupled to control electrodes of the first and second semiconductor switches so as to selectively trigger the switches on and off as a function of a control signal supplied by the integrated circuit to the input of the control circuit.

7. An optical indicator device for providing an indication of a control parameter of an integrated circuit (IC) comprising: a pair of input terminals for connection to a source of AC mains voltage, an integrated circuit having a pair of supply voltage terminals, a light-emitting element and a semiconductor switch connected in a parallel-combination so that the switch is able to control the on/off state of the light-emitting element, a resistor, a rectifier, means connecting the rectifier, the resistor, the parallel-combination and the pair of IC supply terminals in series circuit across said pair of input terminals so as to provide a current feed circuit for both the integrated circuit and the light-emitting element, and means responsive to said IC control paramenter for controlling the operation of the semiconductor switch.

8. An optical indicator device as claimed in claim 7 further comprising: a second resistor connected in series with the rectifier and in circuit so as to provide a current path that shunts said parallel-combination whereby a part of the IC feed current flows through the second resistor, and wherein the controlling means includes a control circuit having an input terminal controlled by an output terminal of the IC and an output terminal for controlling the semiconductor switch into an on or off state as a function of the IC control parameter.

9. An optical indicator device comprising at least one parallel-combination of a light-emitting element and a switch for switching said element on and off, the parallel-combination being included in a current path for feeding said element in the switched-on condition, a control input of the switch being coupled via a voltage level displacement circuit to a control circuit, a current feed circuit for an integrated circuit comprising means connecting the current path in series with a dissipation resistor, a rectifying element and the integrated circuit between terminals for connection to an alternating voltage supply so that the current path forms a part of the current feed circuit for the integrated circuit, and a further dissipation resistor connected in parallel with the series-combination of the light-emitting element and the dissipation resistor, the further dissipation resistor reducing the current flowing through the said current path with respect to the feed current for said integrated circuit.

10. An optical indicator device as claimed in claim 9, characterized in that the integrated circuit includes with a voltage stabilizer which supplies a feed voltage for the control circuit.

11. An optical indicator device comprising: a pair of terminals for connection to a source of AC supply voltage, a current rectifying element, a resistor, a light-emitting element and a controlled semiconductor switch connected together in a parallel-combination, an integrated circuit, means serially connecting the rectifying element, the resistor, the parallel-combination and the integrated circuit between said pair of terminals to provide a current feed circuit for the integrated circuit and for the light-emitting element, a second resistor connected in shunt across the series-combination of the light-emitting element and the first resistor whereby a part of the feed current for the integrated circuit flows through the second resistor, and a control circuit having an input coupled to the integrated circuit and an output coupled to a control electrode of the semiconductor switch so as to trigger the semiconductor switch on and off as a function of a control voltage supplied by the integrated circuit to the input of the control circuit, said semiconductor switch in the on state short circuiting the light emitting element in a manner such that the feed current to the integrated circuit is substantially the same in either state of the semiconductor switch.

* * * * *

UNITED STATES PATENT AND TRADEMARK OFFICE
CERTIFICATE OF CORRECTION

PATENT NO. : 4.672.367
DATED : June 9. 1987
INVENTOR(S) : Ate K. Damstra

It is certified that error appears in the above-identified patent and that said Letters Patent is hereby corrected as shown below:

Claim 3 , line 12   delete "semiconductor" insert --transistor--

Claim 3  line 13   delete "semiconductor" insert --transistor-- line 16   delete "semiconductor" insert --transistor-- line 19   delete "semiconductor" insert --transistor

Claim 10 , line 2  delete "with"

Signed and Sealed this

Twenty-eighth Day of February, 1989

Attest:

DONALD J. QUIGG

Attesting Officer    Commissioner of Patents and Trademarks